United States Patent
Guarin et al.

(12) 
(10) Patent No.: US 6,456,104 B1
(45) Date of Patent: Sep. 24, 2002

(54) METHOD AND STRUCTURE FOR IN-LINE MONITORING OF NEGATIVE BIAS TEMPERATURE INSTABILITY IN FIELD EFFECT TRANSISTORS

(75) Inventors: Fernando J. Guarin, Millbrook; Anastasios A. Katsetos; Stewart E. Rauch, III, both of Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/377,335

(22) Filed: Aug. 18, 1999

(51) Int. Cl.[7] ............................................. G01R 31/02
(52) U.S. Cl. ................................. 324/769; 324/158.1
(58) Field of Search ................. 324/765, 769, 324/763, 158.1, 73.1; 257/368, 369, 364, 40, 48, 66, 72; 327/581; 438/14, 17, 18

(56) References Cited

U.S. PATENT DOCUMENTS

| | | | | |
|---|---|---|---|---|
| 3,714,522 A | * | 1/1973 | Komiya et al. | 257/364 |
| 4,086,642 A | * | 4/1978 | Yoshida et al. | 327/581 |
| 4,574,208 A | * | 3/1986 | Lade et al. | 257/914 |
| 5,412,227 A | * | 5/1995 | Zommer | 257/368 |
| 5,543,632 A | * | 8/1996 | Ashley | 257/148 |
| 5,625,288 A | | 4/1997 | Snyder et al. | 324/158.1 |
| 6,255,809 B1 | * | 7/2001 | Yang et al. | 324/158.1 |

OTHER PUBLICATIONS

"Impact of Negative–Bias Temperature Instability on the Lifetime of a Single–Gate CMOS Structures with Ultrathin (4–6nm) Gate Oxides" by Ogawa et al. Jpn. J. Appl. Phys. vol. 35 (1996) pp. 1484–1490, (Month unavailable).

* cited by examiner

Primary Examiner—Vinh P. Nguyen

(57) ABSTRACT

A MOSFET test structure and associated electronics for rapidly heating the MOSFET gate oxide and for applying a stress voltage to the gate. The structure has at least one polysilicon gate with two spaced contacts that permit a heating current to flow through the gate thus rapidly raising the gate temperature to a desired level. External electronics permit applying a measured stress voltage to the gate. The structure is particularly useful in NBTI testing of p-MOSFETs.

19 Claims, 2 Drawing Sheets

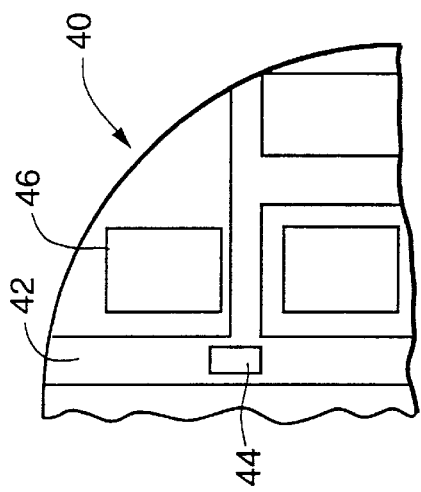
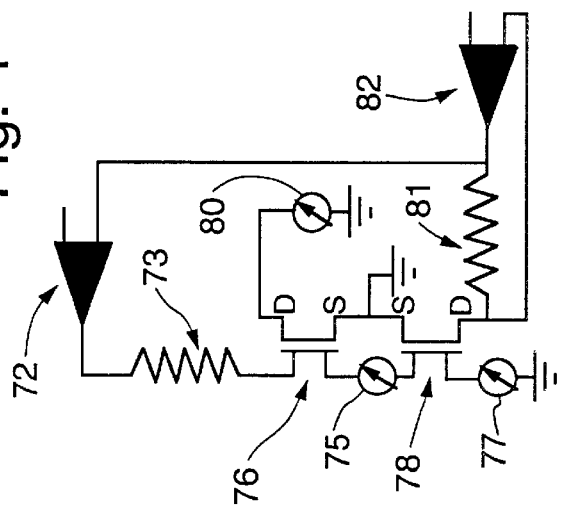
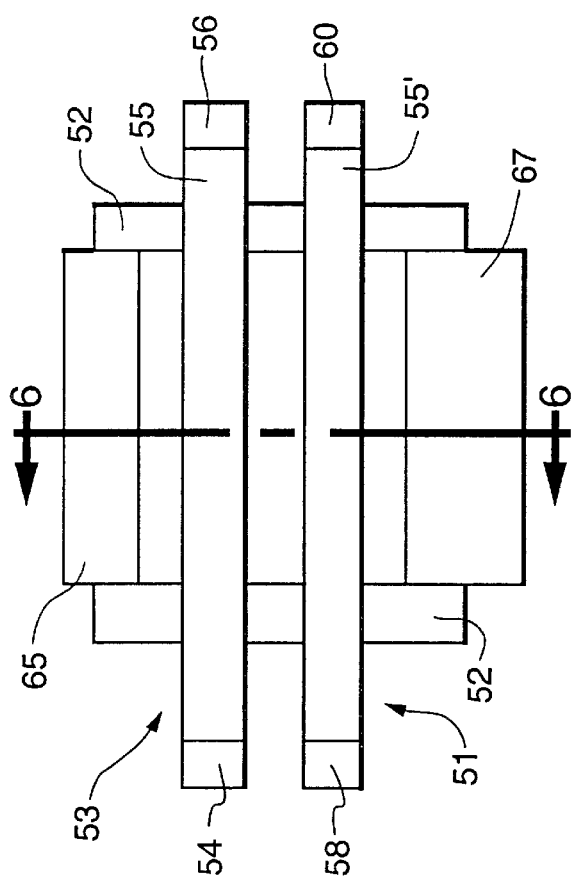
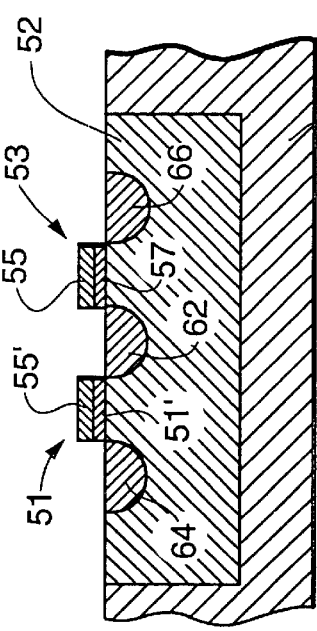

METHOD AND STRUCTURE FOR IN-LINE MONITORING OF NEGATIVE BIAS TEMPERATURE INSTABILITY IN FIELD EFFECT TRANSISTORS

TECHNICAL FIELD

The present invention relates generally to wafer level reliability testing of semiconductor devices and, more particularly, to accelerated MOSFET testing for negative bias temperature instability effects.

BACKGROUND OF THE INVENTION

Negative bias temperature instability (NBTI) in a metal oxide semiconductor field effect transistor (MOSFET) is a serious problem to the long-term stability of the MOSFET, particularly p-type transistors and complementary metal oxide semiconductor (CMOS) devices having $n^+$ polycrystalline silicon gates. NBTI results from charge buildup at the silicon-silicon oxide interface and is due to the influence of negative voltages on the gate electrode of MOS structures. As explained in an article titled "Impact of Negative Bias Temperature Instability on the Lifetime of Single-Gate CMOS Structures with Ultrathin (4–6 nm) Gate Oxides," by Shigeo Ogawa et al., appearing in the Japanese Journal of Applied Physics, vol. 35, pt. 1, no. 2B, page 1484 (1996), the phenomenon arises after long-term stressing of the MOSFET at elevated temperatures and generally occurs even in low fields ($6 \times 10^6$ volts/cm or less).

This instability is particularly pronounced in $n^+$ polycrystalline silicon gate MOS structures, and was studied in the past extensively during the early stages of MOS transistor development. More recently, particularly with the development of high-speed MOS devices having gates with thin oxide layers, often less than 5 nm, there has developed a need for reliable testing techniques for such ultrathin oxides. One of the tests used to determine the life of devices having such thin oxide layers is a bias-temperature test (BT) and is based on NBTI of MOS structures. This test is performed at elevated temperature, although under constant voltage. The current state of the art achieves the necessary elevated temperature primarily by heating a wafer in an heating chuck. Such heating requires a long testing period to uniformly heat the wafers.

In U.S. Pat. No. 5,625,288 issued on Apr. 29, 1997 to Snyder et al., there is disclosed a different way to heat a test element. As shown in this reference, a polysilicon heater pad is placed near the test line. This configuration permits heating the test line without needing to raise the temperature of the full wafer.

Although the placement of heating pads adjacent the test element provides an obvious reduction in the time needed to raise the temperature of the test element, particularly when the test element is a thin line that is placed along the length of the heating pad, this technique still involves conductive heating of the wafer area containing the test element. When the test element is a MOSFET, the pads must heat an area sufficiently large to contain the full transistor structure so as to assure that the gate oxide layer has reached the desired temperature. Consequently, the process is again time consuming.

There is thus a need in the art of reliability testing of MOSFETs by NBTI techniques for the convenient and rapid increase in the temperature of the MOSFET gate oxide layer, preferably without having to heat the full wafer on which the transistor is built.

SUMMARY OF THE INVENTION

To meet this and other needs, and in view of its purposes, the present invention provides a test MOSFET structure. The structure comprises a MOSFET having a gate with a polysilicon layer. Two spaced electrical contact points are positioned on the polysilicon layer. This structure may be used in a test system for negative bias thermal instability testing of MOSFETs, the system comprising:

a) a test MOSFET device having a gate comprising a polysilicon layer with first and second gate contacts spaced from each other on the polysilicon layer; and b) off-chip electronic circuitry for applying a heating current to the gate through the contacts, for applying a bias voltage to one of the gate contacts, and for measuring a shift in the applied bias voltage.

After forming the above structure, NBTI testing of a MOSFET is done. Such testing typically involves establishing a threshold bias voltage, heating and stressing the MOSFET under test, and measuring any shift on the established threshold voltage. According to the present invention, the testing process comprises forming a test MOSFET in a semiconductor substrate, the MOSFET having a gate comprising a polysilicon layer, two spaced gate electrical contacts on the polysilicon layer, and an oxide layer; and then applying a heating current through the gate contacts to produce a current flow in the polysilicon layer to raise its temperature thereby also raising the oxide layer temperature to a desired level. Typically, before applying the heating current, a threshold gate bias voltage is established and, following the step of applying the heating current, any shift in the threshold bias voltage is measured. Before measuring the threshold voltage shift and following application of the heating current, the additional step of stressing the MOSFET is performed by applying a stress voltage to one of the gate contacts.

In an alternate embodiment, the test MOSFET may comprise a combination of two adjacent MOSFETs each having a gate and, preferably, a common source. The gates are serially connected, each gate comprising a polysilicon layer, two spaced electrical contacts on the polysilicon layer, and an oxide layer. A first contact of the first MOSFET gate is connected to off-chip electronic circuitry for applying a heating current to the MOSFETs and a first contact of the second MOSFET gate is connected to the off-chip electronic circuit for applying a bias voltage to the second MOSFET.

One of the two MOSFETs is used to control the flow of current through the two gates through a feedback circuit and the other MOSFET is used for the NBTI testing. In this case, the testing process includes, in addition to the step of forming the two MOSFETs, applying a heating current to both gates by connecting the two MOSFET gates in series and connecting a contact of the first MOSFET gate and a contact of the second MOSFET gate to a current source.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 4 shows in schematic representation a portion of a wafer including a test MOSFET in the wafer dicing channel;

FIG. 5 shows a top view of an alternate test MOSFET structure according to the present invention;

FIG. 6 shows a schematic elevation cross section along line 6—6 of FIG. 5; and

FIG. 7 shows an electrical circuit connected to the test MOSFET to form a test system according to the present invention.

DETAILED DESCRIPTION OF THE INVENTION

Figure 1:
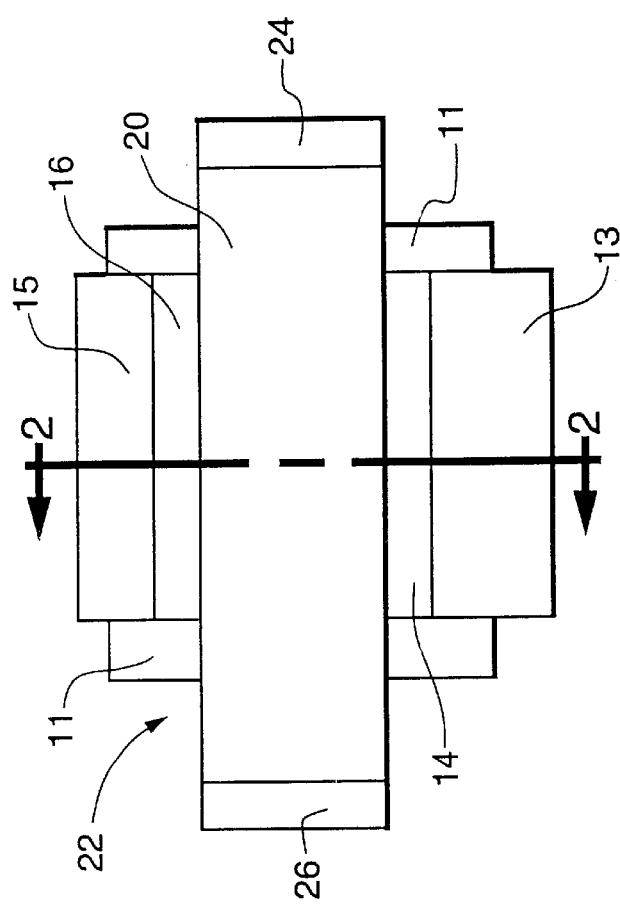
FIG. 1 shows a top view of a first test MOSFET according to the present invention.

Referring now to the drawing, in which like reference numbers refer to like elements throughout, FIG. 1 shows a schematic representation of a top view of a test MOSFET device fabricated on a semiconductor wafer in accordance with the present invention. The wafer typically is a silicon wafer eventually will contain a large plurality of what, after slicing, become integrated circuit chips. Each of the chips contains a plurality of semiconductor devices, including MOSFETs, as is well known in the art.

Figure 2:
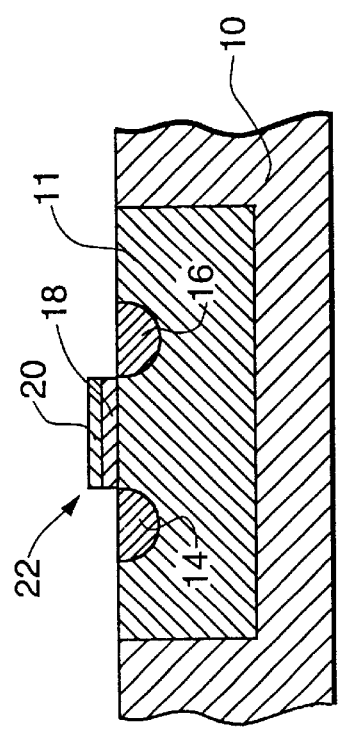
FIG. 2 shows a schematic elevation cross section along line 2—2 of FIG. 1.

In the structure illustrated in FIGS. 1 and 2, there is created in a semiconductor substrate 10, preferably a silicon substrate, an n-well 11. An oxide layer 18 ($SiO_2$) and a polycrystalline silicon (polysilicon) layer 20 are deposited over the substrate to form a gate 22 of the MOSFET. Gate 22 is preferably elongated and may extend beyond the boundary of n-well 11. P-junctions 14 and 16 are formed in the usual manner to form the source and drain of the test MOSFET. Contacts 13 and 15 permit external access to the source and drain, respectively. (Contacts 13 and 15 have been omitted in FIG. 2 to avoid cluttering the figure.) Spaced electrical contacts 24 and 26 are formed on the polysilicon layer 20 of the gate 22, preferably at the two extremes along the long dimension of the gate 22.

The technology for forming the test MOSFET is well known in the art and needs no further elaboration. It comprises the usual steps of wafer preparation, oxidation, diffusion, ion implantation, chemical vapor deposition, metalization, and planarization typically using photolithography. All such steps are well known and described in numerous texts and articles on the subject including the text by S. Wolf and R. Tauber titled "Silicon Processing for the VLSI Era," published in 1986 by Lattice Press of Sunset Beach, Calif.

As shown in FIG. 1, the first spaced electrical contact 24 and the second spaced electrical contact 26 on the polysilicon layer 20 are spaced from each other. Thus, a current flow may be induced between first spaced electrical contact 24 and second spaced electrical contact 26. Because the polysilicon layer 20 presents a measurable resistance to such flow, the application of the current flow heats the polysilicon layer 20. Heating of the polysilicon layer 20 results in heating of the oxide layer 18 under the polysilicon layer 20 which is typically in intimate contact with the polysilicon layer 20. Because of the intimate contact of the oxide layer 18 with the polysilicon layer 20, because the oxide layer 18 is extremely thin (under 10 nm), and, finally, because the two layers 18, 20 are also substantially coextensive, the heating of the oxide layer 18 is extremely uniform and rapid.

Figure 3:
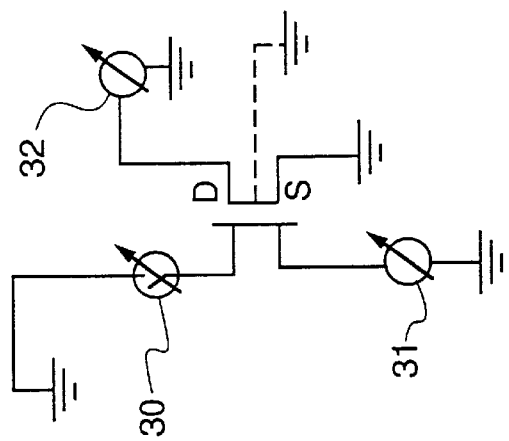
FIG. 3 shows an electrical circuit connected to the test MOSFET to form a test system according to the present invention.

FIG. 3 shows an external electrical circuit connected to the test MOSFET to form a test system. A heating current source 30 is connected through a contact probe (not shown) to one of the two gate contacts, first spaced electrical contact 24 for instance.

A voltage source 31 ($V_G$) is connected to the other gate contact, second spaced electrical contact 26. A voltage source 32 ($V_D$) is connected to the drain. The MOSFET source and bulk are connected to ground. During the heating cycle, $V_D=0$. Whenever a voltage or a current source illustrated in the figures is shown to include an arrow, the arrow means that the source includes associated measuring electronics to determine voltage or current, respectively.

In operation, the test system is first calibrated by mounting the wafer containing the test MOSFET on a traditional heating chuck as previously done. With the heating current Ih=0 and low $V_G$, a voltage $V_D$ is applied between the drain and the source. The chuck temperature ($T_{chuck}$) is varied and the current flow Id between the drain and source is measured to provide Id=f($V_{G1}$, $T_{chuck}$). Second, with the chuck temperature at room temperature, the heating current is varied and the current flow Id between the drain and source is measured again to provide Id=f(Ih). From the above data, the relationship T=f(Id) is obtained.

In the second step, if there is a significant voltage difference between the voltage $V_{G2}$ appearing at the gate during the heating current application and $V_{G1}$ used in the first step, the difference in Id must be considered in the calibration step. This may be done by obtaining a second f($V_{G1}$, Id) by setting $V_{G1}=V_{G2}$ and repeating the first step.

Once Ih is determined for a desired temperature of the oxide layer 18 it can be used to raise the MOSFET to a desired temperature instead of using a heating chuck. After the onset of the heating current flow, a stressing voltage $V_{GS}$ is applied through voltage source 31 for a desired time. At the expiration of this time, both the heating current flow and the stressing voltage $V_{GS}$ are interrupted, and the test completed as in the case of the traditional heating of the MOSFET, typically by measuring any shift in the threshold voltage values by comparing the values before and after stressing the transistor. The test may then be repeated, each time measuring shifts in the threshold voltage. The results are interpreted in the same manner as when the test is conducted using a traditional MOSFET heated in a heating chuck.

The test MOSFET can be built in the dicing channel of the wafer. This arrangement avoids taking up useful product area and is shown in FIG. 4. Specifically, FIG. 4 illustrates a portion 40 of a wafer having a dicing channel 42 inscribed on the wafer, and a plurality of chips 46. A test MOSFET 44 is schematically represented in the dicing channel 42.

FIG. 5 shows a preferred implementation of the present invention in which there is shown a different, more efficient design in which the test MOSFET device comprises a structure with two adjacent MOS transistors. One of the two transistors is used as a temperature sensing transistor and the other is used as a stress testing transistor. As shown in FIGS. 5 and 6, the device is again built in an n-well 52 in a semiconductor substrate 50. In this structure, two substantially identical gates 51 and 53 having polysilicon layers 55 and 55' and oxide layers 57 and 57', respectively, and four gate contacts 54, 56, 58, and 60 are created over the surface of the substrate 50.

A p-junction is formed between the two gates 51, 53 forming a common source 62. Two p-junctions forming a thermal sense drain 64 and a stress voltage drain 66 with drain electrical contacts 65 and 67, respectively, are formed to create the test MOSFET. Such contacts are well known in the art and need no further discussion. Again, as in FIG. 2, the drain and source contacts are not shown in FIG. 6 to avoid undue cluttering of the figure.

FIG. 7 shows an external, off-chip electrical circuit preferably used with the embodiment of the present invention illustrated in FIGS. 5 and 6. As seen in the circuit, the two MOSFET gates 51, 53 are connected in series. An operational amplifier voltage source 72 provides a heating current Ih to the two serially connected gates 51, 53 through a current limiting resistor 73. (Voltage sources may be positive or negative depending on whether the MOSFET is p- or n-type and, therefore, polarity is not shown in the figures.) A voltage source 75 ($V_{GS}$) applies a measured stress voltage to the gate of the test MOSFET. A bias voltage source 77 ($V_{GB}$) is also illustrated for providing a measured very low bias voltage to the heat sense MOSFET 78.

To the drain of the test MOSFET 76 there is connected a voltage source 80 ($V_D$) for applying a voltage to the drain of the test transistor. The common source is grounded. The drain of the heat sense MOSFET 78 is connected to an operational amplifier voltage source 82 through a resistor 81 which forms part of the feedback circuit used to control the heating current Ih to maintain a desired current flow and therefore a desired temperature.

Temperature calibration is again done as previously by mounting the wafer with the MOSFETs on a heating chuck, setting the bias voltage at a low voltage, Ih=0, and measuring Id in the heat sensing MOSFET as a function of $V_{GB}$ and temperature. The wafer is then brought back to room temperature, a heating current Ih is applied, and Ih is measured again as a function of Id. From the two measurements, T as a function of Ih is obtained.

For test purposes, because both transistors have the same heating current flowing through both gates, their channel temperatures are also substantially identical. The gate voltage of the temperature sense transistor is kept low (around $V_{Gthreshold}$) to avoid stressing the heat sense MOSFET 78. A stress voltage $V_{GS}$ is applied to the stress transistor gate and, after a desired time has elapsed, testing is performed by interrupting the stress voltage application and determining any threshold voltage shift for the stressed transistor in the same manner as done in the case where the heating of the MOSFET gate oxide layer was done on a heating chuck.

The present invention has been explained with reference to two specific structures and two associated external circuits for applying a heating current and a stress voltage to a test MOSFET. The MOSFETs illustrated have been of the p-type. Of course, n-type MOSFETs may also be tested in a similar fashion by providing multiple gate contacts in a test device for applying a heating current directly to the device, therefore greatly reducing the time required to heat the device to the desired test temperature. The heat control circuits disclosed are also provided to assist in illustrating the present invention. Other feedback temperature control circuits (which may include a thermal diode) as well as components other than operational amplifier voltage sources may be used and remain within the scope of the present invention. The test described is particularly useful in NBTI, although other tests requiring the rapid heating of an element having a polysilicon gate or similar structure, for which the heating method described above may be applied, are also within the scope of the present invention.

Thus, although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A test system for negative bias thermal instability testing of MOSFETs, the system comprising:
    a) a test MOSFET having a gate, the gate including a polysilicon layer, a first gate contact disposed on the polysilicon layer, and a second gate contact disposed on the polysilicon layer and spaced from the first gate contact; and
    b) off-chip electronic circuitry applying a heating current to the gate through the contacts, for applying a threshold bias voltage to one of the gate contacts, and measuring a shift in the applied gate threshold bias voltage.

2. The system according to claim 1 wherein the off-chip electronic circuitry further comprises a source of stress voltage connected to one of the gate contacts.

3. The test system according to claim 1 further comprising a second MOSFET having a common source with said test MOSFET, said second MOSFET also having a gate, said second MOSFET gate comprising a polysilicon layer and an oxide layer, a third gate contact disposed on the polysilicon layer, and a fourth gate contact disposed on the polysilicon layer and spaced from the third gate contact, wherein
    (i) the test MOSFET and the second MOSFET have a common source;
    (ii) the second electrical contact is electrically connected to the third electrical contact, and the first and fourth electrical contacts are connected to the off-chip electronic circuitry for applying a heating current to both the test MOSFET and the second MOSFET gates; and
    (iii) the off chip electronic circuit also applies a threshold voltage to the second MOSFET.

4. The system according to claim 3 further comprising a stress voltage source connected to one of the contacts on each of said test and second MOSFET gates.

5. The system according to claim 4 further comprising a feedback circuit connected between the test and second MOSFETs.

6. The system according to claim 5 wherein the feedback circuit is a heating current limiting circuit.

7. The system according to claim 1 wherein the test MOSFET is fabricated on a semiconductor wafer, the semiconductor wafer includes a dicing channel, and the test MOSFET is located in the dicing channel.

8. The system according to claim 1 wherein the MOSFET is a p-type MOSFET.

9. The system according to claim 8 wherein the p-type MOSFET gate includes an oxide layer and the oxide layer is less than 10 nm thick.

10. A test MOSFET structure comprising:
    A) a first MOSFET having a gate, the gate including
        (a) a polysilicon layer and
        (b) two spaced electrical contacts disposed on the polysilicon layer such that a current flow applied between the two spaced electrical contacts on the polysilicon layer heats the polysilicon layer; and
    B) a second MOSFET adjacent the first MOSFET, the second MOSFET also having a gate, the second MOSFET gate having substantially the same dimensions as the first MOSFET gate, the second MOSFET gate also including
        (a) a polysilicon layer and
        (b) two spaced electrical contacts disposed on the polysilicon layer such that a current flow applied between the two spaced electrical contacts on the polysilicon layer heats the polysilicon layer,
wherein
the first MOSFET and the second MOSFET share a common source and one of the two spaced electrical contacts of the second MOSFET gate is electrically connected to one of the two spaced contacts of the first MOSFET gate.

11. The test MOSFET structure according to claim 10 wherein the first MOSFET is a p-type MOSFET.

12. A process for stressing prior to testing a MOSFET for negative bias thermal instability, the MOSFET comprising a gate, the gate comprising a polysilicon layer, two spaced electrical contacts on the polysilicon layer and an oxide layer adjacent said polysilicon layer, wherein the process for stressing the MOSFET comprises first raising the MOSFET oxide layer to a desired temperature, and wherein process for raising the MOSFET oxide layer to said desired temperature comprises:

applying a heating current through the gate contacts to produce a current flow-in the polysilicon layer to raise the polysilicon layer temperature thereby also raising the oxide layer to a desired stress temperature.

13. The process for stressing a MOSFET according to claim 12 further comprising applying a voltage to one of the gate contacts and establishing a threshold voltage and, after raising the temperature of the oxide layer, measuring any shift on the established threshold voltage.

14. The process according to claim 13 wherein following the step of applying a heating current there is performed an additional step of stressing the MOSFET by applying a stress voltage to one of the gate contacts.

15. The process according to claim 12 wherein the step of forming the test MOSFET further comprises fabricating the test MOSFET on a semiconductor wafer that includes a dicing channel, and locating the test MOSFET in the dicing channel.

16. A process for heat stressing a test MOSFET prior to testing said test MOSFET for negative bias thermal instability, the process comprising:

(a) forming said test MOSFET comprising a gate, a source and a drain, said gate further comprising:
a polysilicon layer,
a first and a second spaced electrical contact on the polysilicon layer, and
an oxide layer adjacent said polysilicon layer;

(b) forming a heat sense MOSFET adjacent and interconnected to said test MOSFET through a common source, said heat sense MOSFET also comprising a gate, said gate comprising:
a polysilicon layer,
a third and a fourth spaced electrical contacts on the polysilicon layer, and (c) connecting one of said first and second contacts of the test MOSFET gate to one of said third and fourth contacts of the heat sense MOSFET gate thereby connecting said test MOSFET gate and said heat sense MOSFET gate in series;

(d) applying a heating current from a current source to said series connected gates through said gate contacts to produce a current flow in the polysilicon layer of each gate to raise the polysilicon layer temperature of each of said gates, thereby also raising the oxide layer of each of said gates to a desired stress temperature; and (e) controlling said heating current through a feedback circuit connected to said heat sense MOSFET and said current source.

17. The process according to claim 16 further comprising a step of controlling the heating current through a feedback signal.

18. The process according to claim 17 wherein following the step of applying the heating current there is performed an additional step of stressing the test MOSFET by applying a stress voltage to one of the test MOSFET gate contacts.

19. The process according to claim 18 further comprising the step of applying a voltage to one of the gate contacts of said test MOSFET and establishing a threshold voltage and, after raising the temperature of the oxide layer and applying the stress voltage, measuring any shift on the established threshold voltage.

* * * * *